United States Patent
Kim et al.

(10) Patent No.: US 10,162,913 B2
(45) Date of Patent: Dec. 25, 2018

(54) SIMULATION DEVICE AND SIMULATION METHOD THEREFOR

(75) Inventors: Kyoung Hoon Kim, Suwon-si (KR); Joong Baik Kim, Seoul (KR); Seung Wook Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 859 days.

(21) Appl. No.: 14/233,610

(22) PCT Filed: Jul. 20, 2012

(86) PCT No.: PCT/KR2012/005799
§ 371 (c)(1),
(2), (4) Date: Jan. 17, 2014

(87) PCT Pub. No.: WO2013/015569
PCT Pub. Date: Jan. 31, 2013

(65) Prior Publication Data
US 2014/0156251 A1  Jun. 5, 2014

(30) Foreign Application Priority Data
Jul. 22, 2011 (KR) .................. 10-2011-0073219

(51) Int. Cl.
*G06F 17/50* (2006.01)
*G06F 11/34* (2006.01)
*G06F 9/50* (2006.01)

(52) U.S. Cl.
CPC ........ *G06F 17/5022* (2013.01); *G06F 9/5066* (2013.01); *G06F 11/3457* (2013.01);
(Continued)

(58) Field of Classification Search
CPC ............. G06F 17/5009; G06F 17/5036; G06F 11/261; G06F 11/3419; G06F 11/3457; H04L 41/145
(Continued)

(56) References Cited

U.S. PATENT DOCUMENTS 5,987,243 A    11/1999  Aihara
6,321,363 B1*  11/2001  Huang ................ G06F 17/5022
                                                        703/16
(Continued)

FOREIGN PATENT DOCUMENTS

CN    101860752 A    10/2010
CN    102004630 A    4/2011
(Continued)

OTHER PUBLICATIONS

Tia et al., "Assigning Real-Time Tasks and Resources to Distributed Systems," International Journal of Mini and icrocomputers, Acta Press, vol. 17, No. 1, pp. 18-25, Jan. 1, 1995, Anaheim, CA, USA.
(Continued)

*Primary Examiner* — Eunhee Kim
(74) *Attorney, Agent, or Firm* — Jefferson IP Law, LLP

(57) ABSTRACT

The present invention relates to a simulation method and device. According to the present invention, a simulation method using a plurality of blocks comprises: a dividing step of dividing a simulation into computation operations for performing unique operations on the blocks and communication operations for data exchanges between different blocks; a grouping step of performing a grouping between the interdependent computation and communication operations; and a simulation performing step of performing an operation included in each group using the blocks according to whether or not the level of interdependency between the computation and communication operations is resolved.

18 Claims, 25 Drawing Sheets

(52) U.S. Cl.
CPC ...... *G06F 11/3495* (2013.01); *G06F 17/5009* (2013.01); *G06F 11/3419* (2013.01); *G06F 2209/5017* (2013.01)

(58) Field of Classification Search
USPC .............................................. 703/13, 14, 21
See application file for complete search history.

(56) References Cited

U.S. PATENT DOCUMENTS

| | | | |
|---|---|---|---|
| 8,453,102 B1* | 5/2013 | Pack ..................... | G06F 17/505 716/139 |
| 2005/0283785 A1 | 12/2005 | D'Souza | |
| 2007/0101318 A1 | 5/2007 | Tatsuoka et al. | |
| 2008/0192653 A1 | 8/2008 | Onodera | |
| 2011/0055839 A1 | 3/2011 | Alexander et al. | |
| 2011/0067016 A1 | 3/2011 | Mizrachi et al. | |
| 2012/0180068 A1 | 7/2012 | Wein et al. | |
| 2013/0060557 A1* | 3/2013 | Archer ................ | G06F 17/5022 703/21 |

FOREIGN PATENT DOCUMENTS

| | | |
|---|---|---|
| CN | 102089752 A | 6/2011 |
| JP | H10-74214 A | 3/1998 |
| JP | 2003-067439 A | 3/2003 |
| JP | 2003-233633 A | 8/2003 |
| JP | 2007-122602 A | 5/2007 |
| JP | 2008-198025 A | 8/2008 |
| KR | 10-2011-0023832 A | 3/2011 |
| WO | 2010-004474 A2 | 1/2010 |
| WO | 2011-009638 A1 | 1/2011 |
| WO | 2011-017026 A1 | 2/2011 |

OTHER PUBLICATIONS

Ramamritham, "Allocation and Scheduling of Precedence-Related Periodic Tasks", IEEE Transactions on Parallel and Distributed Systems, IEEE Service Center, pp. 412-420, Apr. 1, 1995, Los Alamitos, CA, USA.

Hermann et al., "Interactive Physical Simulation on Multi Core Archicture", XP007910344, pp. 1-9, Feb. 10, 2009.

* cited by examiner

FIG. 1
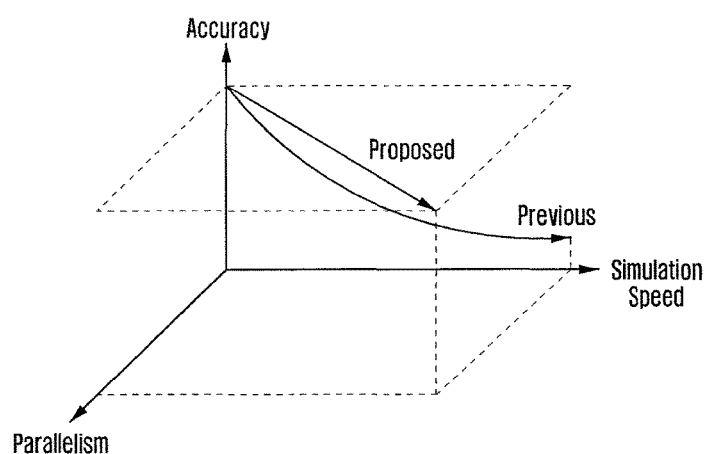
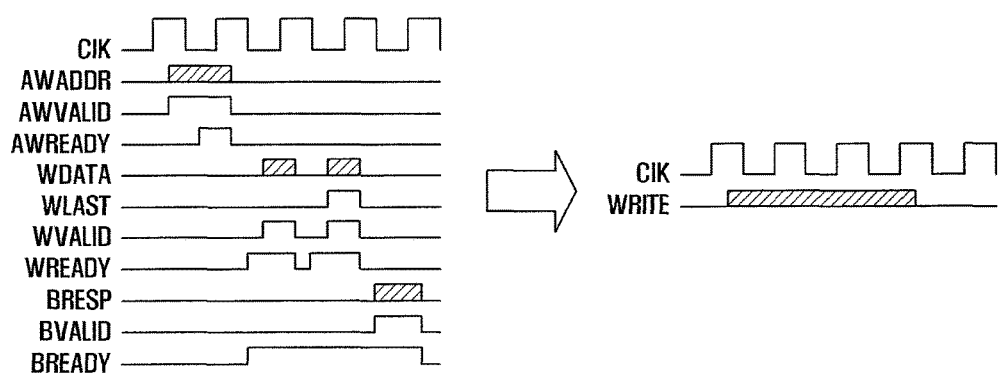

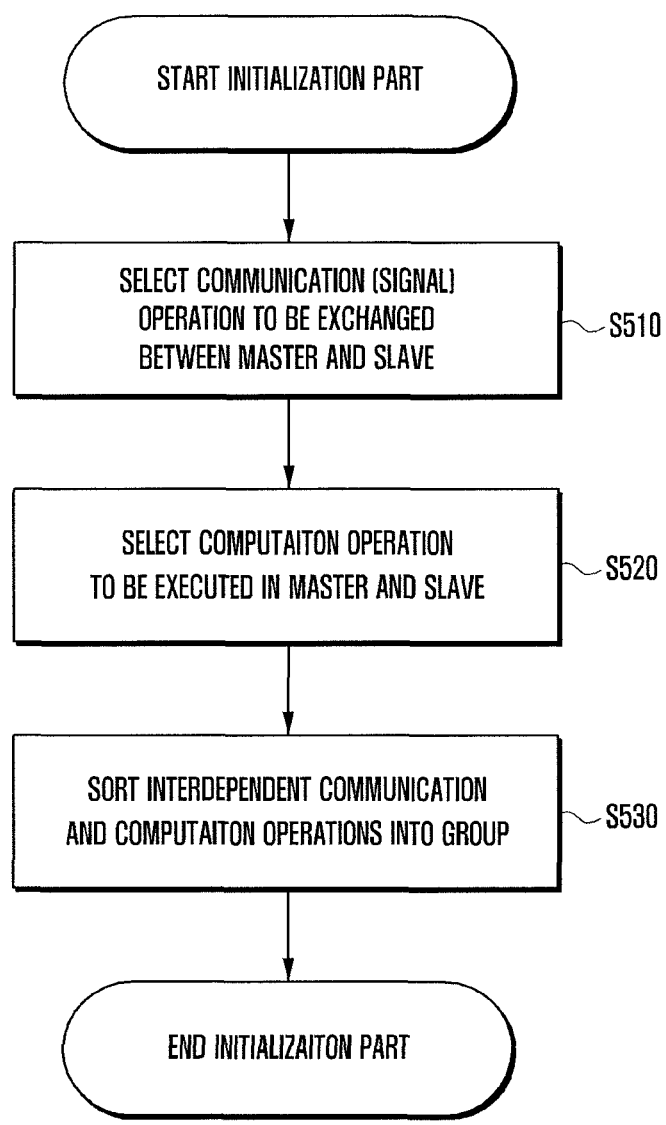

SIMULATION DEVICE AND SIMULATION METHOD THEREFOR

TECHNICAL FIELD

The present invention relates to a simulation method and device for pre-measuring and predicting system performance quickly and precisely. In more particular, the present invention provides a parallel simulation method for extracting interdependent computation and communication into a plurality of groups and processing the groups in parallel, a distributed simulation method for introducing virtual shadow nodes among a plurality of nodes and preprocessing tasks according to the type of the address area of the task requested by a certain node, and apparatuses thereof.

BACKGROUND ART

System simulation for analyzing system structure and performance is inevitable to manufacture the system such as smartphone, TV, and electric appliance. The simulation makes it possible to optimize the system while fulfilling the required performance without error. The simulation method is performed to pre-measure and predict the system performance and very important to analyze and assess the system.

However, as the system complexity increases to meet the requirements of new features such as multi-core, Graphic Processing Unit (GPU), Software (S/W) platform, and Application Processor (AP) in the recent years, the simulation speed has reached its limit.

In order to overcome this problem, a recently proposed method increases the simulation speed by dropping the simulation accuracy. Although this method increases the simulation speed, its simulation analysis result is unreliable.

There is therefore a need of a simulation method capable of assessing the system performance accurately without compromising the simulation speed.

DISCLOSURE OF INVENTION

Technical Problem

The present invention has been conceived to solve the above problem and aims to provide a simulation method and device capable of pre-measuring and predicting the system performance quickly and precisely.

In detail, the present invention aims firstly to provide a parallel simulation method and device capable of extracting inter-dependent computation and communication into a plurality groups and processing the groups in parallel.

Also, the present invention aims secondly to provide a distributed simulation method and device capable of introducing virtual shadow nodes among a plurality nodes and pre-processing according to the type of the address area of the task requested by a certain node.

Solution to Problem

In accordance with an aspect of the present invention, a method for performing simulation using a plurality of blocks includes decomposing the simulation into computation operations for performing unique function of the blocks and communication operations for exchanging data between different blocks, grouping interdependent computation and communication operations into groups, and executing operations included in each group using the blocks depending on whether dependency between the computation and communication operations are resolved.

In accordance with another aspect of the present invention, a device for performing simulation using a plurality of blocks includes a structure storage unit which store at least one group constituting the simulation, an execution unit which includes a plurality of blocks performing the simulation, and a control unit which controls decomposing the simulation into computation operations for performing unique function of the blocks and communication operations for exchanging data between different blocks, grouping interdependent computation and communication operations into groups, and executing operations included in each group using the blocks depending on whether dependency between the computation and communication operations are resolved.

In accordance with another aspect of the present invention, a method for performing simulation in a distributed system including at least two nodes connected to each other and having a plurality of blocks includes configuring a shadow block at each node, receiving, at the shadow block, an operation request transmitted from on node to another node, and pre-processing, at the shadow block, the requested operation.

In accordance with still another aspect of the present invention, a device for performing simulation in a distributed system includes at least two nodes including a plurality blocks, wherein each node receives a request for an operation transmitted from one node to another node and includes a shadow block for pre-processing the operation.

Advantageous Effects of Invention

The simulation method of the present invention is advantageous to assess the system performance precisely without compromising the simulation speed. The simulation method of the present invention may be applied to System on Chip (SoC), terminal, and other embedded devices to manufacture optimized products. Also, the simulation method of the present invention is capable of analyzing various situations through prompt and precise simulation so as to contribute to the product performance improvement.

BRIEF DESCRIPTION OF DRAWINGS

FIG. 1 is a diagram illustrating relationship among system simulation parameters (accuracy, simulation speed, and parallelism) of a conventional technology and an embodiment of the present invention.

FIG. 5 is a flowchart illustrating a procedure of grouping operations by independency for performing parallel simulation according to the first embodiment of the present invention.

MODE FOR THE INVENTION

In the present invention, the device performing simulation is referred to 'host', and the host may include a plurality of blocks for performing certain computations or predetermined operations. The term 'block' may be substituted by the term 'master' or 'slave'. According to an embodiment of the present invention, a computer is used as the host for performing simulation.

Exemplary embodiments of the present invention are described with reference to the accompanying drawings in detail. The same reference numbers are used throughout the drawings to refer to the same or like parts. Detailed description of well-known functions and structures incorporated herein may be omitted to avoid obscuring the subject matter of the present invention.

As described above, as the system complexity increases, the simulation speed has reached its limit. In order to overcome this problem, it may be considered to introduce a method of increasing the simulation speed by decreasing the simulation accuracy. This is described with reference to FIG. 1.

FIG. 1 is a diagram illustrating relationship among system simulation parameters (accuracy, simulation speed, and parallelism) of a conventional technology and an embodiment of the present invention.

As shown in FIG. 1, the conventional technology uses a method of increasing the abstraction level. That is, the conventional technology uses a method of increasing the simulation speed at the cost of the simulation accuracy. However, this method makes it difficult to rely on the accuracy of the simulation analysis result.

An embodiment of the present invention proposes a method for conducting the simulation promptly without compromising simulation accuracy through parallel processing.

The method for simulating a system through parallel computing (processing) may use a multi-core processor or a distributed computer.

These are described with reference to FIGS. 2 and 3.

Figure 2:
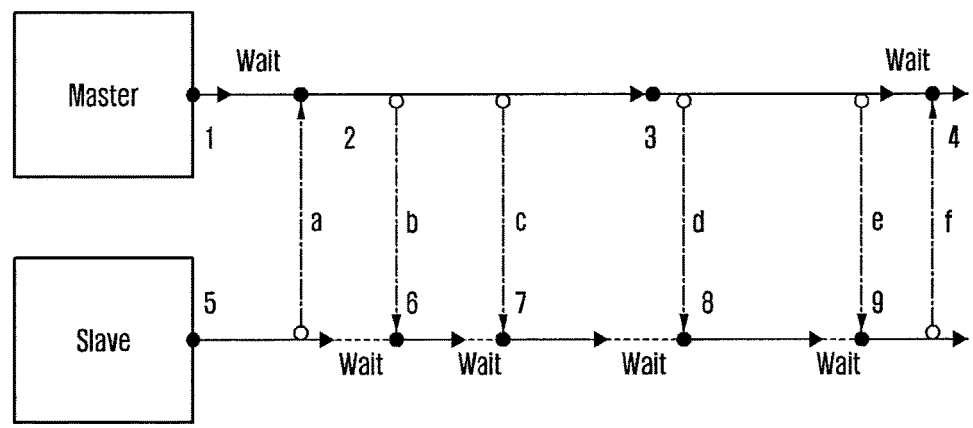
FIG. 2 is a diagram illustrating a parallel processing method for conducting the simulation in parallel, exemplary parallel system, and problem thereof.

FIG. 2 is a diagram illustrating a parallel processing method for conducting the simulation in parallel, exemplary parallel system, and problem thereof.

In the case that the first processing block (e.g. master) and the second processing block (e.g. slave) conduct simulation in parallel, there is a dependency between the master and slave in association with the wire signal as shown in FIG. 2. If this dependency is not resolved, the master or the slave may have to wait until a certain task being processed completely. For example, the computation 6 cannot start until the communication b has completed and thus the slave has to be in the idle state without performing any operation before the master has completed the communication b.

This means that the core stops working and, if this situation occurs frequently, the simulation speed drops significantly. Assuming the system operating at 1 GHz clock, waiting occurs 1,000,000,000 times and this influence the drop of the simulation speed significantly until the final simulation result is acquired.

Meanwhile, the number of cores allocated to one node of the simulation device (e.g. computer) is limited. In order to overcome this imitation, the recent supercomputer uses a method of clustering several nodes. This is exemplified in FIG. 3.

Figure 3:
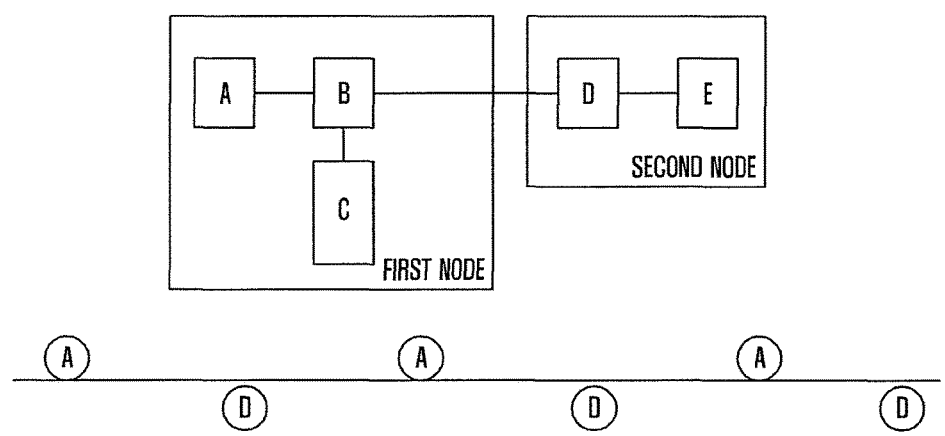
FIG. 3 is a diagram illustrating an exemplary of implementing the distributed system by clustering several nodes.

FIG. 3 is a diagram illustrating an exemplary of implementing the distributed system by clustering several nodes.

In the case that a plurality of nodes is clustered, the communication speed among different nodes drops significantly as compared to the communication among the cores in the same node. This may cause bad influence to the system simulation performance.

For example, if the block A located at the first node reads the data from the block D located at the second node, the simulation speed may drop significantly due to the characteristics of the physical link connecting the first and second nodes.

The present invention proposes a method for solving the problem occurring when the simulation is performed in the parallel system and the distributed system.

Each block (core, memory, bus, etc.) of the embedded system may be classified into one of computation and communication blocks. In this case, the computation denotes the unique function of a specific block, and the communication denotes data exchange between two different blocks. In an exemplary case of a memory, receiving an address from the outside is communication, and executing an internal logic to transmit the data of the corresponding address is the computation.

In the following, the description is made of the first and second embodiments of the present invention. In this case, the first embodiment is directed to the simulation optimization method in the parallel system using the multicore. The second embodiment is directed to the simulation optimization method in the distributed system.

Figure 4:
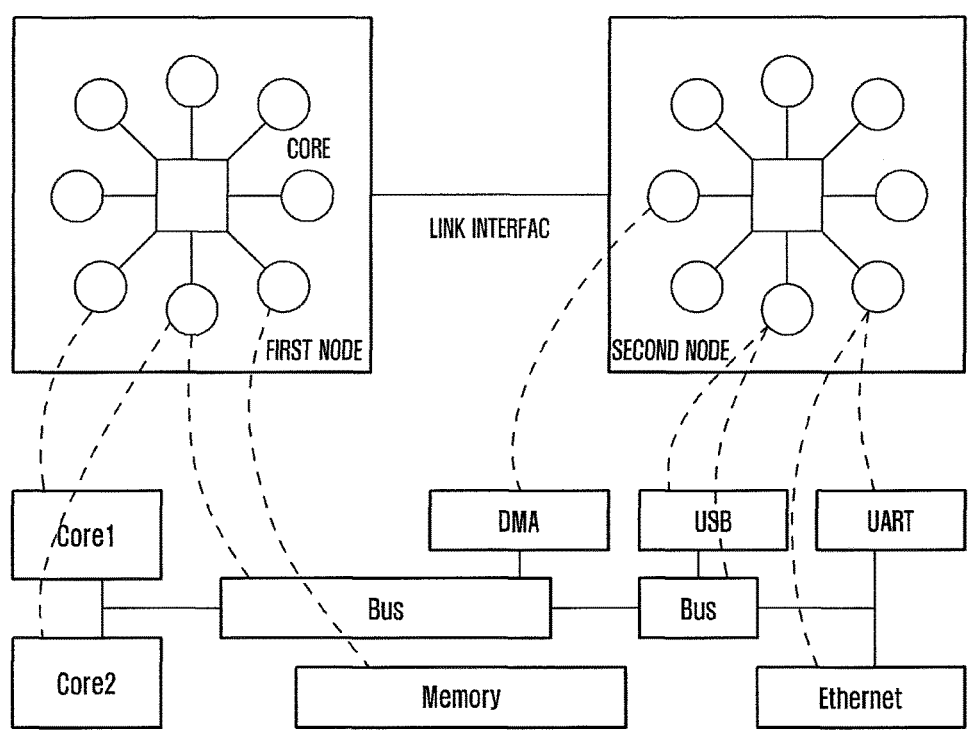
FIG. 4 is a diagram illustrating a system for performing simulation according to an embodiment of the present invention.

An embodiment of the present invention may be implemented as shown in the simulation system depicted in FIG. 4.

As shown in FIG. 4, the host performing simulation is a distributed system to which at least two nodes including the first and second nodes are connected. The link may include a wire link and/or wireless link. In this case, each node has the parallel computing environment including at least two cores, i.e. multicore. The blocks located at each node may be mapped to the respective physical function blocks constituting the hose.

The cores and nodes have a simulation platform which is mapped to each core. The blocks of the platform communicate with each other such that the simulation progresses.

In an embodiment of the present invention, the simulation on the same node is referred to as parallel simulation, and the simulation among different nodes is referred to as distributed simulation.

The first and second embodiments of the present invention are described based on the above assumption.

First Embodiment

Hereinafter, a description is made of a parallel simulation optimization method for use in the parallel system using at least to cores.

As shown in FIG. 2, the master and slave exchange data in the parallel simulation. However, in the case that any data necessary at one side is not processed completely at the other side, it is inevitable to wait.

In order to solve this problem, the present invention proposes a parallel simulation method for extracting and sorting interdependent computation and communication operations into plural groups and processing the computation and communication operations of each group independently and in parallel.

FIG. 5 is a flowchart illustrating a procedure of grouping operations by independency for performing parallel simulation according to the first embodiment of the present invention.

FIG. 6 is diagrams illustrating procedures of grouping operations by independency though drawings of computation and communication operations in performing simulation with graphics.

Figure 6A:
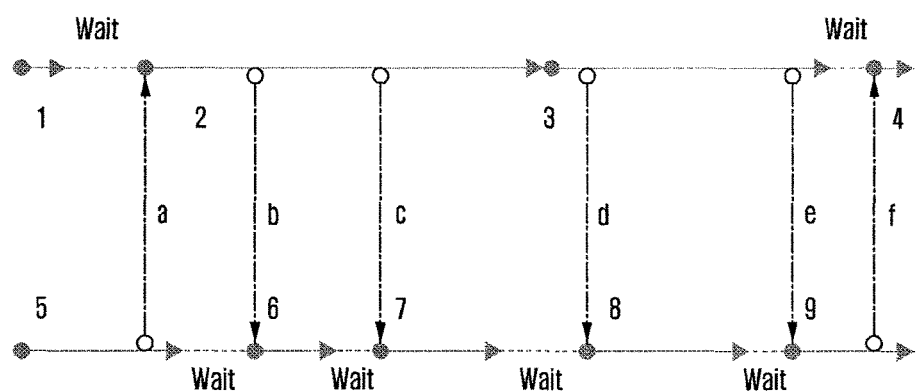
FIG. 6 is diagrams illustrating procedures of grouping operations by independency though drawings of computation and communication operations in performing simulation with graphics.
Figure 6B:
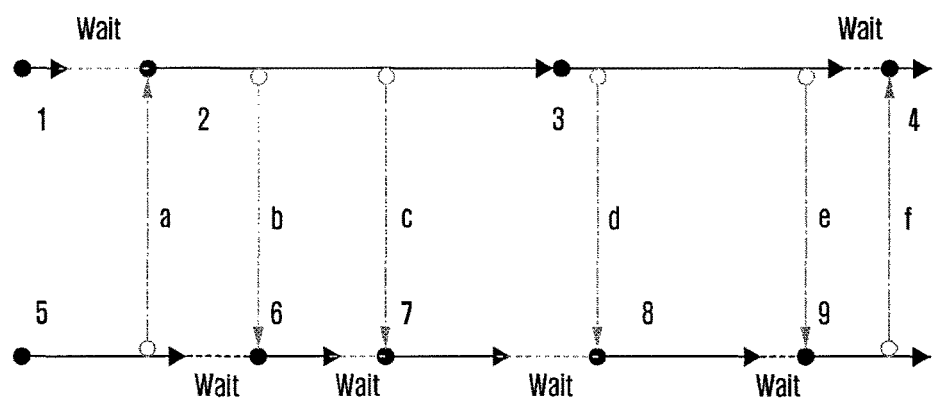
Figure 6C:
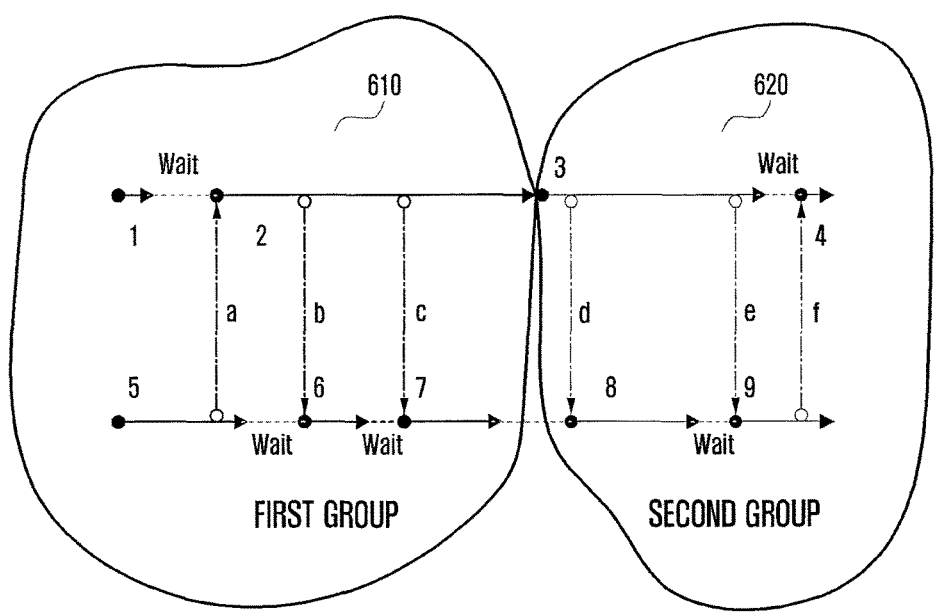

In FIGS. 6a to 6c, the upper line denotes computation operation performed by the master, and the lower line denotes the computation operation performed by the slave. The lines connecting the upper and lower lines denote communication operations occurring between the master and slave.

First, the simulation device is assigned a certain simulation operation. The simulation device extracts the communication operation to be exchanged between the master and slave from the simulation operation at step S510. In FIG. 6a, the operations are denoted by reference alphabet a, b, and c. The simulation device sorts the extracted communication operations in temporal order depending on the dependency. In this case, the computation operation positioned before and after the communication operation have a dependent relationship.

The simulation device extracts the computation operations of the master and slave associated with the communication operation at step S520. These are denoted by reference numerals 1, 2, and 3 in FIG. 6b. The communication operation may be considered as performing unique functions of the master or slave block. For example, if the master is a core, processing the assigned task is the computation operation and, if the slave is a memory, executing an internal logic to transfer the data at the corresponding address to the outside is the computation operation.

If a new communication operation occurs between the computation operations, the simulation device segment the computation operation into smaller units.

The simulation device sorts the interdependent computation and communication operations into a group at step S530. The communication and computation operations in the same group have dependency and connected to each other. However, the operations of different groups are independent. That is, there is no dependency.

FIG. 6c shows an exemplary case where the simulation operations are sorted into the first group 610 and the second group 620. In more detail, the computation operation 2 of FIG. 6c is dependent on the computation operation 1/5 and communication operation a. That is, the computation operation 2 cannot be performed until the computation operation 1/5 and communication operation a complete. However, the computation operation 1 included in the first group 610 and the computation operation 3 included in the second group 620 are independent from each other. That is, the computation operation 3 may be performed any time even before the completion of computation operation 1, and the computation operation 1 may pause, for the computation operation 3, and then resume.

There are many parallel processing elements capable of being sorted into groups due to the nature of hardware block. The first embodiment of the present invention is characterized in that the operations groups are processed in parallel.

Figure 7:
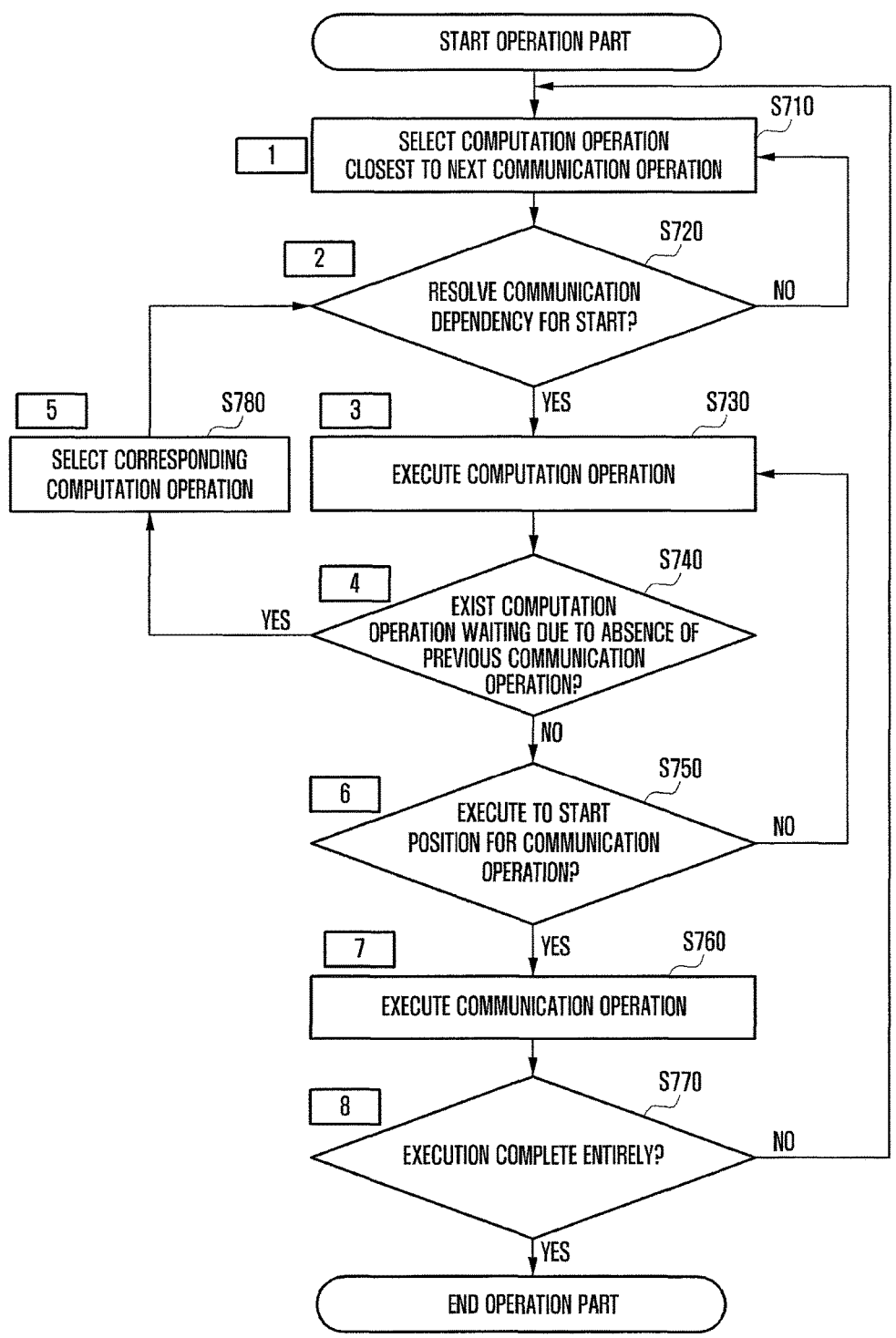
FIG. 7 is a flowchart illustrating a procedure of processing computation and communication operations included in the simulation groups in parallel according to the first embodiment of the present invention.

FIG. 7 is a flowchart illustrating a procedure of processing computation and communication operations included in the simulation groups in parallel according to the first embodiment of the present invention.

FIG. 8 is diagrams illustrating procedures of processing the computation and communication operations included in a plurality of groups of the simulation with graphics.

Prior to explaining the parallel processing procedure of FIG. 7, a basic principle is described hereinafter. Through the master (first block) and slave (second block) performing the simulation, the computation operations included in each group are executed. In this case, the master and slave select the computation operation to be executed currently based on whether the communication operation draws near and whether the communication dependency has been resolved. During the execution of the selected communication operation, if the communication operation execution time arrives, the master and slave execute the corresponding communication operation. If there is any computation operation suspended due to the non-execution of previous communication operation, the master and slave executes the corresponding computation operation first.

The master and slave repeat the above procedure until the assigned simulation completes.

On the basis of the above principle, the simulation execution procedure of the simulation device is described with reference to FIGS. 7 and 8.

It is assumed that the simulations are sorted into the first group 610 and the second group 620 through the grouping procedure of FIG. 6.

Figure 8A:
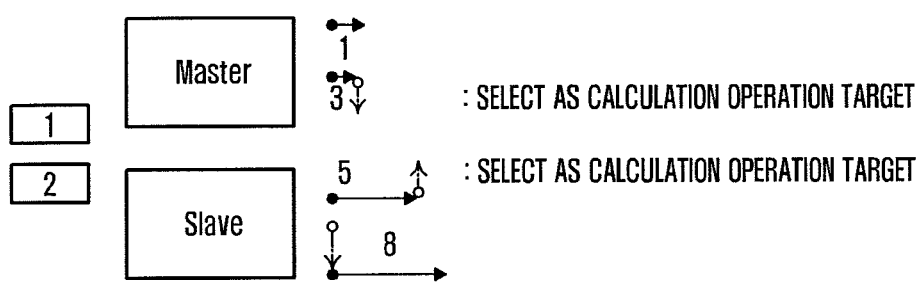
FIG. 8 is diagrams illustrating procedures of processing the computation and communication operations included in a plurality of groups of the simulation with graphics.

Then the simulation device selects the computation operation to be executed based on the two conditions. For this purpose, the simulation device selects the computation operations close to the next communication operation among the computation operations included in the first and second groups 610 and 620 at step S710. Referring to FIG. 8a, the computation operations 1 and 3 are selected at the master, and the computation operations 5 and 8 are selected at the slave.

Next, the simulation device determines whether there is any operation dependent on the communication operation which is not executed yet among the selected computation operations at step S720. Referring to FIG. 8a, the calculation operations 1 and 3 are independent from all communication operations. Accordingly, the computation operation 3 closest to the next communication operation is selected as the computation operation to be executed at the master.

Meanwhile, the computation operation 8 can be executed only when the communication operation d is executed at the slave. That is, the computation operation 8 is dependent on the communication operation d which is not executed yet. However, the computation operation is independent from the communication operation. Accordingly, the computation operation 5 is selected as the operation to be executed currently.

Once the computation operations to be executed at the master and slave have been determined, the simulation device executes the determined computation operations at step S730. The simulation device determines whether there is any computation operation suspended with the absence of communication operation at step S740. If so, the simulation device executes the corresponding computation operation at step S780.

Figure 8B:
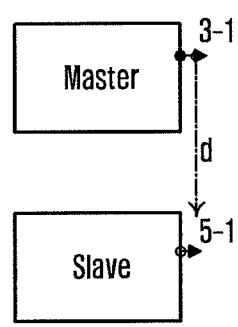

Otherwise, if there is no suspended computation operation, the simulation device determines whether to execute communication operation in the middle of executing the computation operation at step S750. This means that the communication operation d execution time arrives as shown in FIG. 6c. In this case, the simulation device executes the corresponding communication operation at step S760 as depicted in FIG. 8b. The simulation device determines whether all of the computation and communication operations have been executed at step S770 and, if not, returns the procedure to step S710.

Figure 8C:
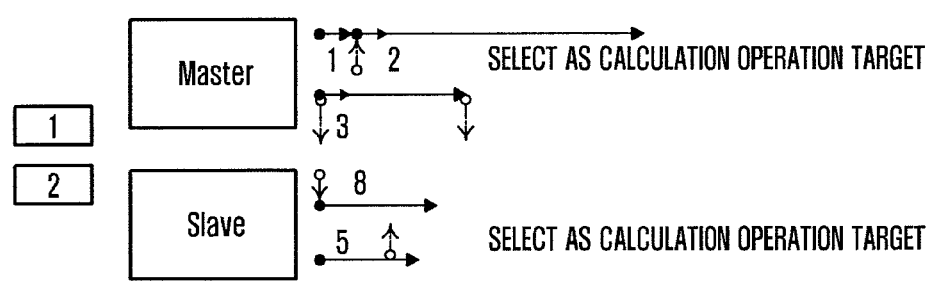

The simulation device selects the targets to execute the computation operation according to the above principle at steps S710 and S720. In more detail, the computation operation 1 is closest to the communication operation at the master. Accordingly, the master selects the computation operation 1 as the computation operation to be executed. Meanwhile, the computation operation 5 is closest to the communication operation at the slave. Accordingly, the slave selects the computation operation 5 as the computation operation to be executed. The computation operations are selected at the master and slave as shown in FIG. 8c.

Figure 8D:
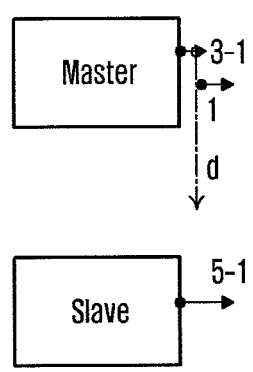

The computation operation execution process progresses until the computation operation 1 completes at the master as depicted in FIG. 8d.

Figure 8E:
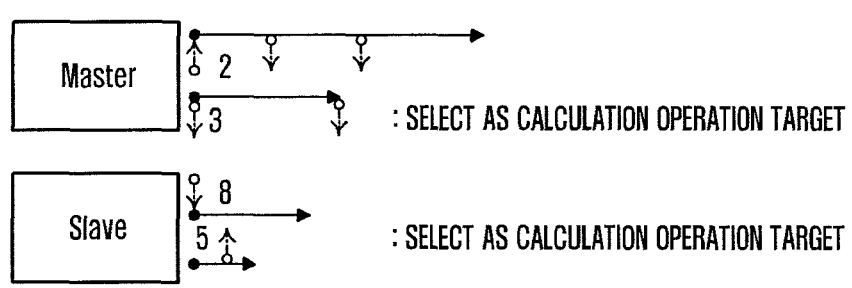

The simulation device selects the target of the computation operation through steps S710 and S720. Referring to FIG. 8e, since the communication operation a is not executed yet, the computation operation 3 is selected as the computation operation to be executed currently instead of the computation operation 2 at the master. Also, since the computation operation 5 is close to the communication operation as compared to the computation operation 8, the computation operation 5 is selected as the computation operation to be executed at the slave.

Figure 8F:
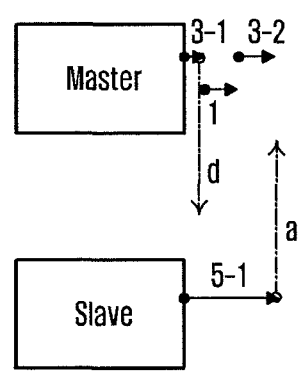

The simulation device runs until the communication operation a is executed as depicted in FIG. 8f.

Figure 8G:
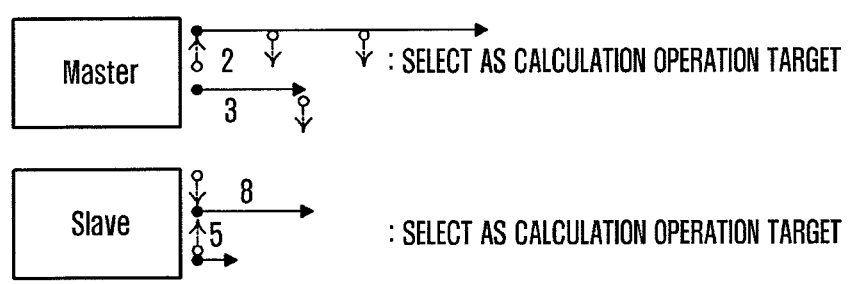
Figure 8H:
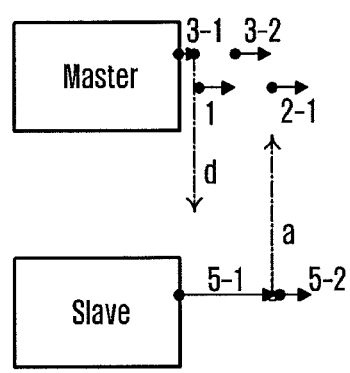

The same principle is applied to FIGS. 8g and 8h, and the above described procedure is performed repeatedly until the currently assigned simulation completes.

In the simulation method of the first embodiment of the present invention, the master and slave perform the simulation with the minimized wait time, resulting in prompt and accurate simulation performance.

Figure 9:
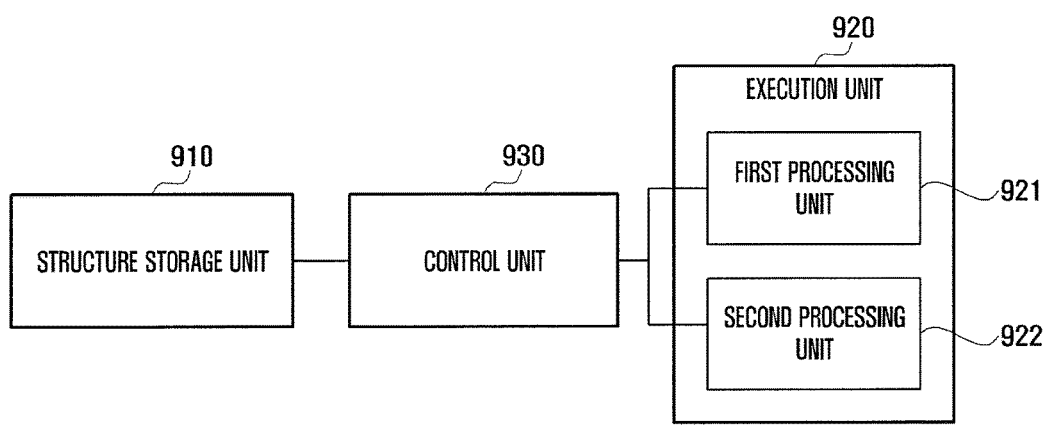
FIG. 9 is a block diagram illustrating a configuration of the simulation device according to the first embodiment of the present invention.

FIG. 9 is a block diagram illustrating a configuration of the simulation device according to the first embodiment of the present invention. As shown in FIG. 9, the simulation device according to the first embodiment may include a structure storage unit 910, an execution unit 920, and a control unit 930.

The structure storage unit 910 stores at least one group constituting the simulation.

The execution unit 920 may include a plurality of blocks executing the simulation. The blocks may include core, memory, bus, etc.

The control unit 930 splits the simulation into computation operations responsible for unique function of the block and communication operation responsible for exchanging data between different blocks. The control unit 930 also sorts the interdependent computation operations into groups. Depending on whether the dependency between the computation and communication operations is resolved, the control unit 930 may control the block to execute the operations included in the respective groups.

Particularly in performing the simulation, the control unit 930 selects a certain block and the computation operations to be executed first by the selected block from the respective groups. In the state of executing the selected computation operations, the control unit 930 selects the computation operation which is independent from the communication operation and closest to the next communication operation and controls the execution unit 902 to execute the selected computation operation.

If a communication operation execution time arrives during the execution of the computation operation, the control unit 930 controls to execute the communication operation.

Figure 10:
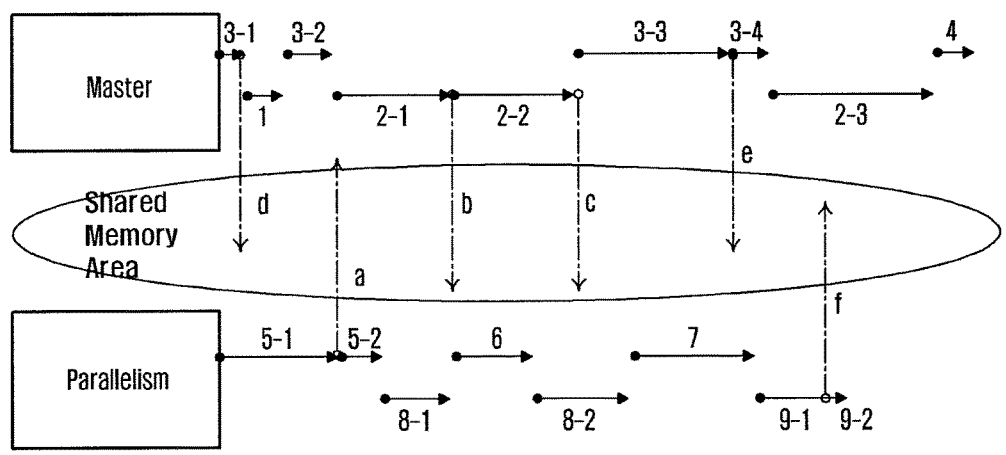
FIG. 10 is a diagram illustrating a procedure of executing the computation and communication operations in series in the simulation method according to the first embodiment of the present invention.

FIG. 10 is a diagram illustrating a procedure of executing the computation and communication operations in series in the simulation method according to the first embodiment of the present invention.

Compared to the conventional parallel simulation method depicted in FIG. 2, FIG. 10 shows that the simulation method according to an embodiment of the present invention is capable of processing simulation promptly by reducing the wait time as compared to the conventional parallel simulation method which has long wait time.

Second Embodiment

In the following, a description is made of the simulation optimization method for us in a distributed system.

The second embodiment proposes a simulation optimization method applicable to the distributed system having at least two function blocks (core, memory, bus, etc.) where a plurality of nodes is clustered.

There is latency between the nodes in the conventional distributed system. The second embodiment of the present invention proposes a method for processing the communication operations promptly by introducing a virtual block called shadow block.

Figure 11:
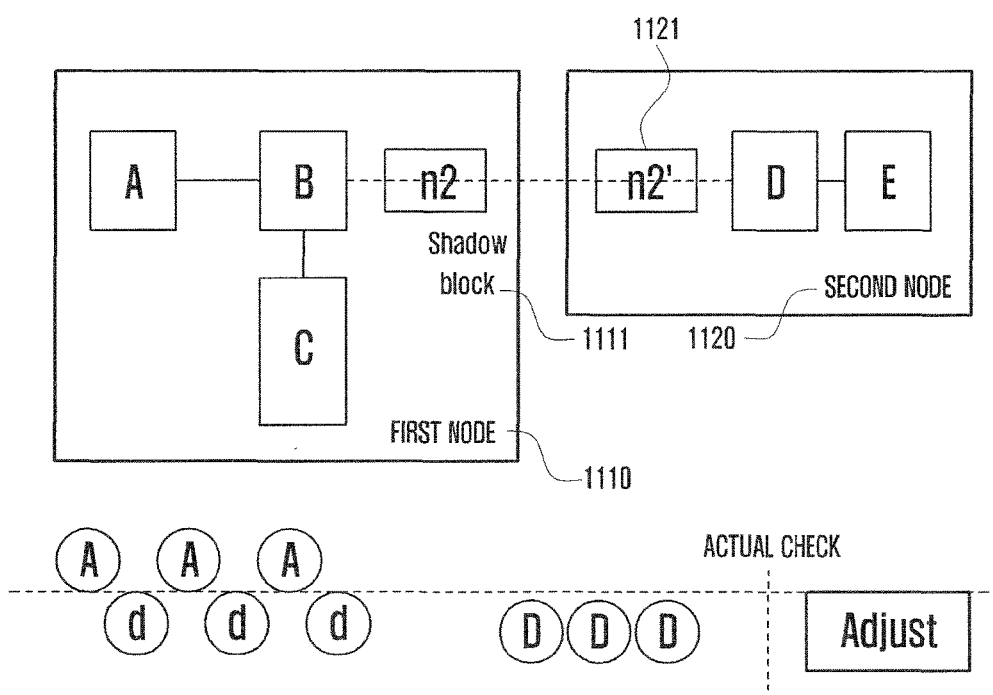
FIG. 11 is a diagram illustrating a simulation optimization method for use in the distributed system according to the second embodiment of the present invention.

FIG. 11 is a diagram illustrating a simulation optimization method for use in the distributed system according to the second embodiment of the present invention.

As shown in FIG. 11, the distributed system according to the second embodiment includes a first node 1110 having a shadow block 1111 and a second node 1120 having a second shadow block 1121.

For example, if the block A of the first node 1110 requests the block D of the second node 1120 for communication, the first shadow block 1111 located at the first node 1110 operates. For this purpose, the first shadow block 1111 performs pre-process on the operation for which the block A of the first node 1110 has requested and then adjusts the operation later. This process is described in detail hereinafter.

The shadow block introduced in an embodiment of the present invention includes at least one address area. Each address area is identified by the property according to the execution function and may be classified into one of memory address area, active device address area (active address area), and passive device address area (passive address area). The memory address area has a normal memory property, i.e. read/write property, the active address area has the property with no predetermined device behavior, and the passive address area has the property with predetermined device behavior.

If the block A of the first node requests the block D of the second node to process a specific operation related to memory input/output, the block A requests the memory address area of the first shadow block for the corresponding command. In contrast, if the block A of the first node requests the block E of the second node for processing operation, the block A requests the passive address area of the first shadow block for the corresponding command.

The shadow blocks configured to the first and second nodes perform the following operation. If the operation requested to the shadow block corresponds to the memory address area (i.e. requested for operation to the memory), the shadow block serves, if corresponding address is provided, a read operation, and writes in the shadow block first and then sends the written content to the counterpart node. If the operation requested to the shadow block corresponds to the active address area (i.e. requested for operation to the active device), the request is by-passed. If the operation requested to the shadow block corresponds to the passive address area (i.e. requested for operation to the passive device, the shadow block serves according to the behavior model and sends this to the corresponding block of the counterpart node. That is, the shadow block performs the corresponding function by modeling the behavior of the passive device.

A description is made of the behavior modeling in detail hereinafter. For example, if the block A commands the block D to output specific string, the block D output the corresponding string and sends the block A an acknowledge (ack) notifying of the output of the corresponding string.

If the shadow block models the behavior of the block D, this means that the block D has the ack signal to be transmitted to the block A and, if the string output command is received from the block A, the shadow block sends the block A the ack directly.

In this way, the shadow block models and retains a signal which a certain block has to feed back after performing a specific behavior. The shadow block sends the feedback signal with priority to the block which has transmitted a certain command. In this embodiment, such an operation is defined as behavior modeling.

Schematizing the above, it can be depicted as shown in the low part of FIG. 11. Referring to the low part of FIG. 11, if block A requests block D for communication, the first shadow block 1111 performs communication d, such a communication repeats three times (AdAdAd). Afterward, the first shadow block 1111 performs actual communication with block D located at the second node 1120 and receives communication result D (DDD). The first shadow block 1111 compares the communication d pre-processed by itself and D received afterward and adjusts the saved value at the first shadow block 1111 using the comparison result.

Hereinafter, a description is made of the second embodiment of the present invention with reference to a flowchart and detailed example.

Figure 12:
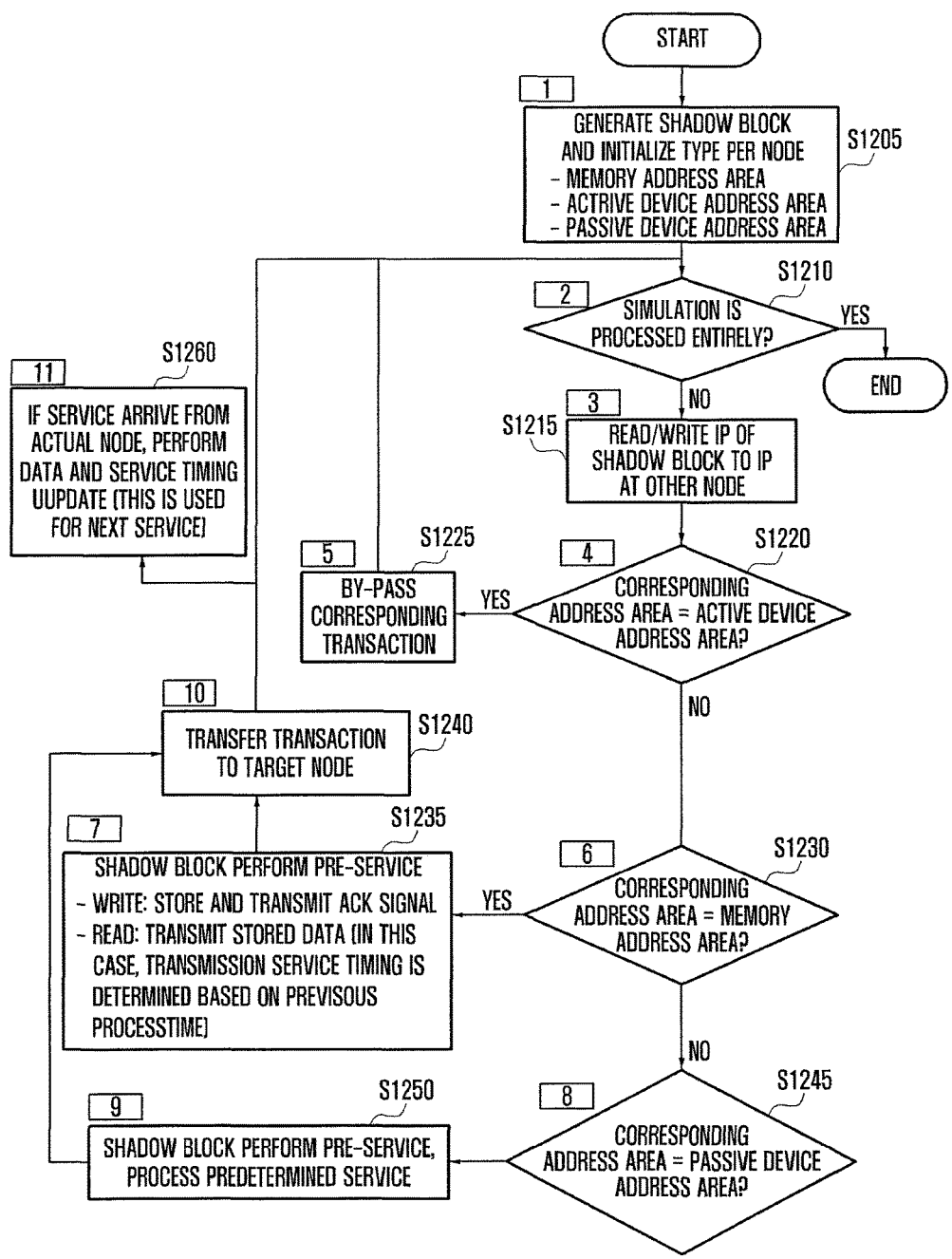
FIG. 12 is a flowchart illustrating the simulation operation procedure according to the second embodiment of the present invention.

FIG. 12 is a flowchart illustrating the simulation operation procedure according to the second embodiment of the present invention.

And FIG. 13 is diagrams illustrating concepts of executing communication operations between nodes using a shadow block.

First, the simulation device generates a shadow block per node at step S1205. The shadow block is defined through the at least one address area as described above.

The simulation device determines whether the simulation has been completed entirely at step S1210. If the simulation has not been completed entirely, the simulation device receives a specific command execution request from a certain block included in the node to which it belongs at step S1215. As described above, the specific command is stored at the address area corresponding to the type of the device as a target of the command. For example, if the type of the device as the target of the command is memory, the corresponding command is stored in the memory address area.

The shadow block determines whether the corresponding address area is the active address area at step S1220. If the corresponding address area is the active address area, the shadow block by-passes the corresponding command (transaction) at step S1250.

Figure 13A:
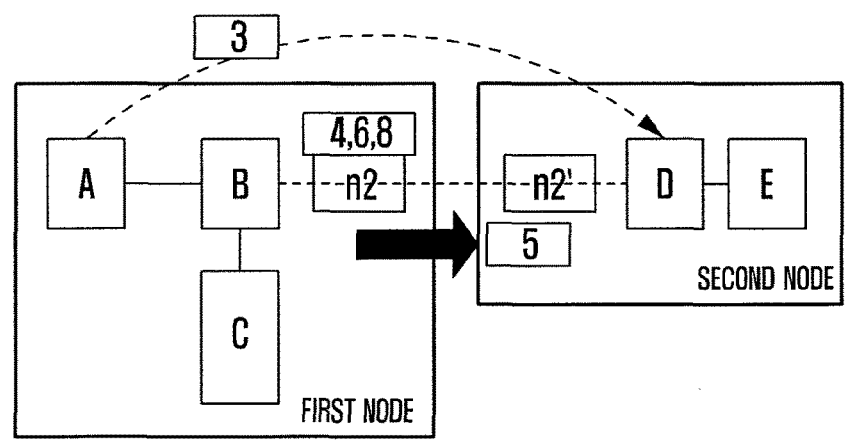
FIG. 13 is diagrams illustrating concepts of executing communication operations between nodes using a shadow block.

The above process corresponds to FIG. 13a. That is, when the block A of the first node requests the block D of the second node for a specific command (reference number 3), if the block D is the active device, the command is by-passed (reference number 5).

Returning to FIG. 12, if the corresponding address area is not the active address area at step S1220, the shadow block determines whether the corresponding address area is the memory address area at step S1230. If the corresponding address area is the memory address area, the shadow block performs pre-processing using the caching data prepared internally at step S1235. In this case, if the corresponding command is 'read', the shadow block sends the retained data and, if the corresponding command is 'write', stores the data first and then ends an acknowledgement signal (ack). If the corresponding command is an initially generated 'read', this means that the shadow block has no data and thus waits until the data is received the block having the data. If the data is received, the shadow block stores the data for use in the pre-processing afterward.

After performing the pre-processing, the shadow block sends the corresponding command (transaction) to the block as the original target of the request at step S1240. Then the shadow block receives the actual processing (post-processing) result from the block as the original target of the request and checks the difference between the pre-processed service timing and the post-processed service timing at step S1260. Here, the timing difference denotes the difference between the time (e.g. number of clocks) taken for preprocessing the service and the time taken for post-processing the service. This means that there may be different in time taken for processing the respective services.

If there is any difference, the shadow block stores the timing information on the post-processed service for use in the next preprocessing. In this case, it is assumed that the preprocessed and post-processed service contents match each other but only difference occurs in timing.

Otherwise if the corresponding address area is not the memory address area, the shadow block determines whether the corresponding address area is the passive address area at step S1245. If the corresponding address area is the passive address area, the shadow block preprocesses a predetermined behavior (in this case, behavior of returning to the block which has requested for the command) to the corresponding device at step S1250. Next, the shadow block performs timing update process at step S1240.

Figure 13B:
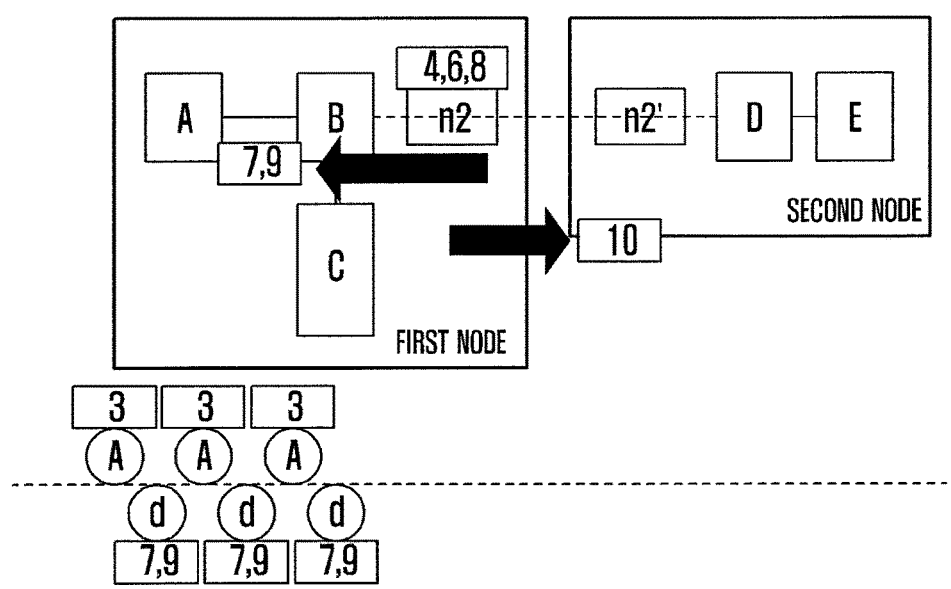
Figure 13C:
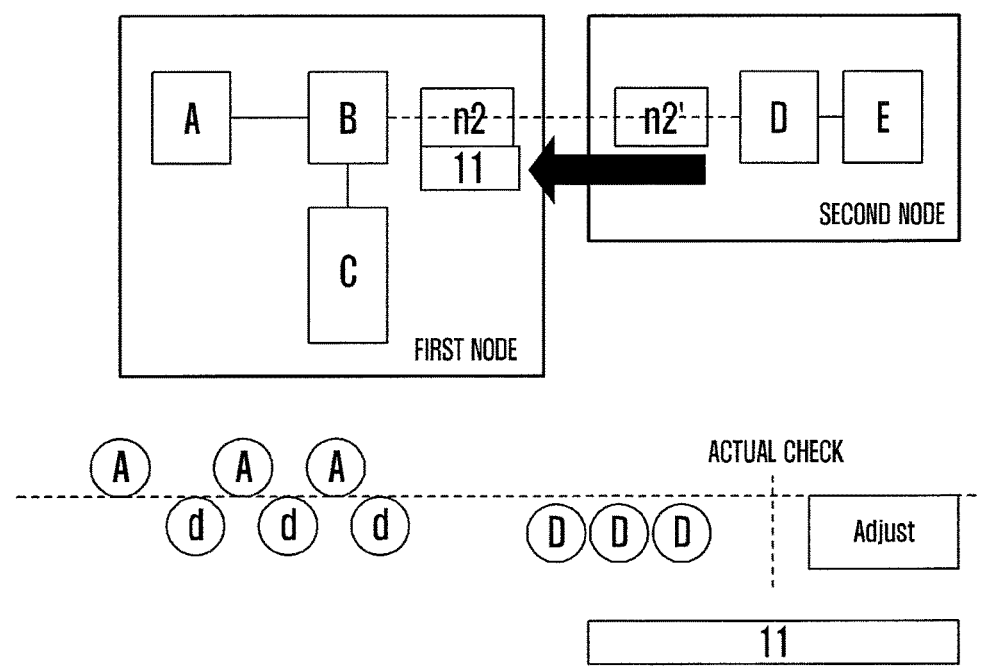

The above process is depicted in FIGS. 13b and 13c. That is, if a specific command request is received (4, 6, 8), the shadow block performs preprocessing (7, 9) and sends the command to the corresponding block of the target node (10). Next, the shadow block receives the timing information from the target node (11) and, if the timing information mismatches the previously stored timing information, updates the corresponding timing information.

Figure 14:
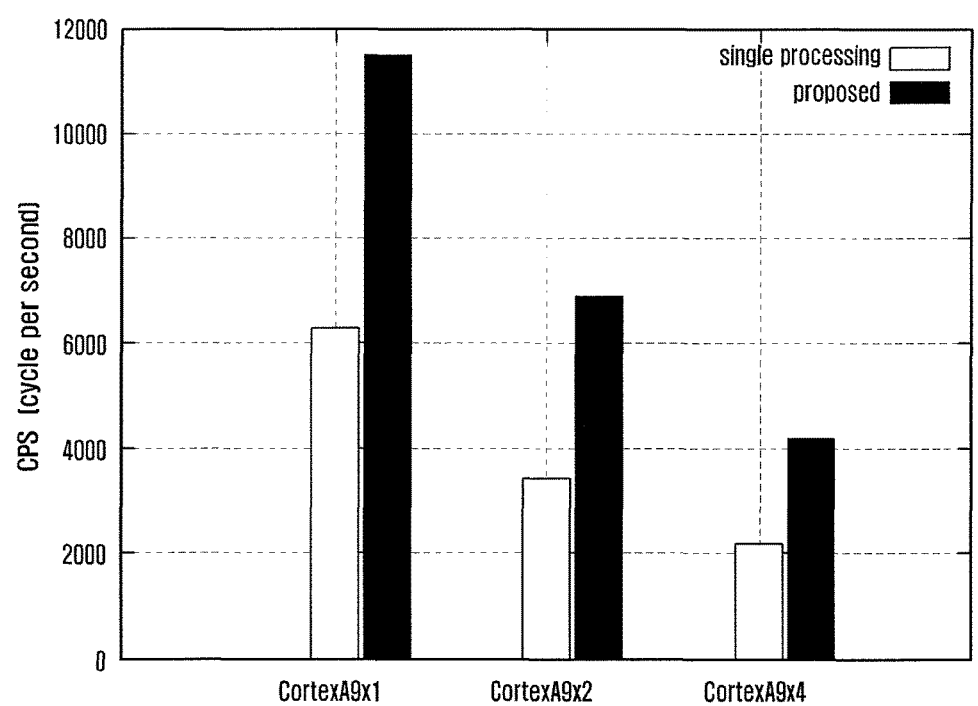
FIG. 14 is a graph illustrating simulation performance enhancement result according to an embodiment of the present invention.

FIG. 14 is a graph illustrating simulation performance enhancement result according to an embodiment of the present invention.

As shown in FIG. 14, the parallel simulation method of the present invention shows the performance enhancement of 91% as compared to the conventional single simulation.

Although preferred embodiments of the invention have been described using specific examples, the specification and drawings are to be regarded in an illustrative rather than a restrictive sense in order to help understand the present invention. It is obvious to those skilled in the art that various modifications and changes can be made thereto without departing from the broader spirit and scope of the invention.

The invention claimed is:

1. A method for performing simulation by a simulation device using a plurality of blocks, the method comprising:
    extracting communication operations from a simulation operation, each of the communication operations being for exchanging data between different blocks, each block simulating an electronic element;
    sorting the communication operations based on dependency between the communication operations;
    extracting computation operations for the plurality of blocks, at least one computation operation of the computation operations being for performing function of a block associated with the communication operations;
    grouping at least one computation operation and at least one communication operation into groups from the computation operations and the communication operations for the plurality of blocks, the at least one computation operation and the at least one communication operation included in one group being dependent on each other; and
    executing operations included in each group using the plurality of blocks based on dependency between the operations.

2. The method of claim 1, wherein the executing of the operations comprises:
    selecting a certain block;
    selecting computation operations to be executed by the selected block from respective groups;
    selecting computation operation independent from communication operation and closest to next communication operation among the selected computation operations; and
    executing the selected computation operation.

3. The method of claim 2, wherein the executing of the operations comprises executing, when an execution time of the communication operation arrives in executing the computation operation, the communication operation.

4. A simulation device for performing simulation using a plurality of blocks, the device comprising:
    a memory configured to store at least one group constituting the simulation; and
    at least one processor configured to control a plurality of blocks when performing the simulation,
    wherein the at least one processor configured to:
        extract communication operations from a simulation operation, each of the communication operations being for exchanging data between different blocks, each block simulating an electronic element,
        sort the communication operations based on dependency between the communication operations,
        extract computation operations for the plurality of blocks, at least one computation operation of the computation operations being for performing function of a block associated with the communication operations,
        group at least one computation operation and at least one communication operation into groups from the computation operations and the communication operations for the plurality of blocks, the at least one computation operation and the at least one communication operation included in one group being dependent on each other, and
        execute operations included in each group using the plurality of blocks based on dependency between the operations.

5. The device of claim 4, wherein the at least one processor is further configured to:
    select a certain block,
    select computation operations to be executed by the selected block from respective groups,
    select computation operation independent from communication operation and closest to next communication operation among the selected computation operations, and
    execute the selected computation operation.

6. The device of claim 5, wherein the at least one processor is further configured to execute, when an execution time of the communication operation arrives in executing the computation operation, the communication operation.

7. A method for performing simulation by a simulation device in a distributed system including at least two nodes connected to each other and having a plurality of blocks, the method comprising:
    configuring a block at each node, the block simulating an electronic element;
    receiving, if an operation request is transmitted from a first node, the requested operation at the block included in the first node;
    pre-processing, at the block included in the first node, the requested operation before the second node processes the requested operation;
    transferring, at the block included in the first node, the operation request to the second node;
    receiving, at the block included in the first node, a processing result transmitted by the second node, the processing result being generated by the second node; and
    adjusting a pre-processing result based on comparing the processing result with the pre-processing result to optimize the simulation of the simulation device.

8. The method of claim 7, further comprising:
    updating at the block, the pre-processing result by receiving a processing result transmitted by the second node.

9. The method of claim 8, wherein the updating comprises updating difference between time taken for performing pre-processed service and the time taken for performing post-processed service.

10. The method of claim 8, wherein the pre-processing comprises performing, when the block receives an operation request for a memory, a read or write function.

11. The method of claim 8, wherein the pre-processing comprises by-passing, when the block receives a computation request for an active device, the operation request.

12. The method of claim 8, wherein the pre-processing comprises performing, when the block receives an operation request for a passive device, a service according to behavior model of the passive device.

13. A simulation device for performing simulation in a distributed system, the device comprising:
    at least one processor; and
    at least two nodes each including a plurality blocks, each block simulating an electronic element,
    wherein the at least one processor is configured to:
        receive, if an operation request is transmitted from a first node, the requested operation at a block included in the first node,
        pre-process, at the block included in the first node, the requested operation before the second node processes the requested operation,
        transfer, at the block included in the first node, the operation request to the second node,
        receive, at the block included in the first node, a processing result transmitted by the second node, the processing result being generated by the second node, and
        adjust a pre-processing result based on comparing the processing result with the pre-processing result to optimize the simulation of the simulation device.

14. The device of claim 13, wherein the at least one processor is further configured to transfer, after pre-processing, the operation request from the block to the second node and update the pre-processing result by receiving a processing result transmitted by the second node.

15. The device of claim 14, wherein the at least one processor is further configured to update difference between time taken for performing pre-processed service and the time taken for performing post-processed service.

16. The device of claim 15, wherein the at least one processor is further configured to perform, when the block receives an operation request for a memory, a read or write function.

17. The device of claim 15, wherein the at least one processor is further configured to by-pass, when the block receives a computation request for an active device, the operation request.

18. The device of claim 15, wherein the at least one processor is further configured to perform, when an operation request is received for a passive device, a service according to behavior model of the passive device.

* * * * *